US 6,559,534 B1

(12) United States Patent
Floriot et al.

(10) Patent No.: US 6,559,534 B1
(45) Date of Patent: May 6, 2003

(54) THERMAL CAPACITY FOR ELECTRONIC COMPONENT OPERATING IN LONG PULSES

(75) Inventors: Didier Floriot, Montigny le Bretonneux (FR); Sylvain DeLage, Orsay (FR); Simone Cassette, Limours (FR); Jean-Pascal Duchemin, Gif S/Yvette (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/720,822

(22) PCT Filed: May 19, 2000

(86) PCT No.: PCT/FR00/01375
§ 371 (c)(1),
(2), (4) Date: Jan. 12, 2001

(87) PCT Pub. No.: WO00/72379
PCT Pub. Date: Nov. 30, 2000

(30) Foreign Application Priority Data

May 21, 1999 (FR) .............................. 99 06513

(51) Int. Cl.$^7$ ................ H01L 23/10; H01L 23/34
(52) U.S. Cl. ........................................ 257/706; 257/707
(58) Field of Search ................ 257/706, 707, 257/712, 713, 723, 724, 198, 197; 438/122

(56) References Cited

U.S. PATENT DOCUMENTS

| 3,761,783 A | 9/1973 | Kroger et al. |
| 5,194,403 A | 3/1993 | Delage et al. |
| 5,411,632 A | 5/1995 | Delage et al. |
| 5,668,388 A | 9/1997 | Delage et al. |
| 5,689,212 A | 11/1997 | Floriot et al. |
| 5,719,433 A | 2/1998 | Delage et al. |
| 5,734,193 A | * 3/1998 | Bayraktaroglu et al. |
| 5,978,396 A | 11/1999 | Duchemin et al. |
| 6,031,255 A | 2/2000 | Delage et al. |
| 6,051,871 A | * 4/2000 | DeLaCruz et al. |

FOREIGN PATENT DOCUMENTS

| DE | 28 39 043 | 3/1979 |
| EP | 0 029 334 | 5/1981 |
| EP | 0 756 322 | 1/1997 |
| FR | 2 328 286 | 5/1977 |
| WO | WO 95/31006 | 11/1995 |

* cited by examiner

Primary Examiner—Sheila V. Clark
(74) Attorney, Agent, or Firm—Oblon, Spivak, McClelland, Maier & Neustadt, P.C.

(57) ABSTRACT

A thermal capacitor component which includes, on a substrate, a stack of different layers defined in the form of a mesa terminating at its upper part in an electrical contact layer, which layer is coated with an electrically and thermally conducting layer surmounted by a heat sink element in contact with the conducting layer. The heat sink element has a plane shape. In addition, the component has at least one pad including another stack of layers which is also coated with an electrically and thermally conducting layer. The heat sink element is also in contact with the conducting layer of this stack so as to conduct the heat from the heat sink element into the substrate. Such a thermal capacitor may find application in the cooling of semiconductor components.

20 Claims, 2 Drawing Sheets

THERMAL CAPACITY FOR ELECTRONIC COMPONENT OPERATING IN LONG PULSES

BACKGROUND OF THE INVENTION

1. Field of the Invention

The invention relates to a thermal capacitor device for electronic components operating in long pulses. It is more particularly applicable to heterojunction bipolar transistors and especially to such transistors operating at microwave frequencies.

2. Discussion of the Background

Microwave components operating in pulses from several tens to several hundreds of microseconds, or even above a millisecond, in duration are used to produce equipment of the air-traffic-control radar type.

In such components, the temperature of the junction varies during the pulse; it firstly rises proportionally to the square root of the time before reaching a high level if the duration is long enough and then comes backs down at the end of the pulse at the same rate before reaching a low level if the duty cycle is substantially smaller than unity.

The maximum temperature rise $\Delta T_{max}$ of the active part of the component, which may be called the junction, during a pulse of length $\tau$ is of the form $$\Delta T_{max}=(1-D)\times \Delta T_{pulse}+D\Delta T_{CW},$$

where:

D is the duty cycle;

$\Delta T_{pulse}$ is the temperature rise in the pulse; and $\Delta T_{CW}$ is the temperature rise which would correspond to a continuous operation of the component with the same power level.

The temperature rise of the junction during an operating pulse of duration $\tau$ generating a thermal power $P_{th}$ over an area S is:

$$\Delta T_{pulse}=(P_{th}/S).(\tau/\lambda.\rho.c_p)^{1/2}$$

where $\lambda$ represents the thermal conductivity of the material in question;

$\rho$ represents its density and $c_p$ represents its specific heat capacity.

The depth of penetration of the heat into the semiconductor material during the period of a pulse, called the thermal diffusion length, is:

$$L=(\tau.\lambda/\rho.c_p)^{1/2}$$

The thermal energy generated during the pulse is:

$$E_{th}=0.5.S.(\lambda.\rho.c_p)^{1/2}.\Delta T_{pulse},$$

where $(\lambda.\rho.c_p)^{1/2}$ represents the thermal effusivity of the material in question, i.e. its ability to rapidly discharge heat from the point where it is generated.

An elementary heterojunction bipolar transistor (HBT) is composed of an emitter, a base and a collector.

This type of transistor comprises (see FIG. 1):

a semiinsulating substrate S made of GaAs;

a subcollector layer SC made of $n^+$-doped GaAs (dopant concentration typically about $4.10^{18}$ cm$^{-3}$;

a collector layer C made of n-doped GaAs (dopant concentration typically about $2.10^{16}$ cm$^{-3}$), GaInP or another semiconductor;

a base layer B made of p-doped GaAs (dopant concentration typically about $7.10^{19}$ cm$^{-3}$);

an emitter layer E made of n-doped GaInP (dopant concentration typically $3.10^{17}$ cm$^{-3}$).

Collector contacts $CC_1$ and $CC_2$ are produced on the subcollector layer SC, base contacts CB1 and CB2 are produced on the base layer B and an emitter contact CE is produced on the emitter layer E.

A microwave-power HBT transistor consists of a larger number of parallel-mounted elementary modules. In order to make the flow of heat through the substrate uniform, the emitters, having a width of a few microns, typically two microns, are separated by a few tens of microns, typically about thirty microns. It is known on such a structure to superpose a thermal shunt as described in French Patent Application No. 97/06682. This thermal shunt extracts some of the heat generated via the top of the emitter in order thereafter to dissipate it through the free space between two elementary transistors separated typically by about ten microns. Thus, we can assume that the area to be taken into account for dissipating the heat is much greater than the total area of the emitter fingers—it approaches the area which surrounds the entire region covered by the transistors.

When a heterojunction transistor operates in long pulses (typically longer than 100 microseconds), the rise in its temperature during a pulse may be close to or greater than 100° C.—this results in a number of drawbacks:

1) the maximum power allowed is often limited by the temperature reached during a pulse rather than by the average power to be dissipated;

2) the power decreases when the temperature rises;

3) the phase varies when the temperature rises.

SUMMARY OF THE INVENTION

The subject of the invention is a solution making it possible to limit the magnitude of the temperature increase and to reach a steady state very rapidly.

The invention therefore relates to an electronic component comprising, on a substrate, a first stack of different layers defined in the form of a mesa terminated at its upper part in an electrical contact layer, which layer is coated with an electrically and thermally conducting layer surmounted by a heat sink element in contact with said conducting layer, characterized in that the heat sink element has a plane shape and in that the component includes at least one pad which consists of a second stack of layers, these being similar to said defined layers, and is also coated with said electrically and thermally conducting layer, said sink element also being in contact with the electrically and thermally conducting layer so as to conduct the heat from the sink element into the substrate.

The invention also relates to a process for producing a heterojunction bipolar transistor, comprising the following steps:

production on a substrate of an alternation of the following layers, with the materials indicated by way of example in parenthesis:

subcollector layer ($n^+$:GaAs)

collector layer ($\mu$:GaAs)

emitter layer (n:GaInP);

etching of the various layers above so as to produce the elementary transistors and to produce pads;

production of the base contacts and collector contacts;

filling of the free spaces between the transistors and the pads with an insulating material and planarization so as to obtain a surface flush with the upper faces of the transistors and of the pads;

deposition of a layer which constitutes a heat sink layer making contact with the upper faces of the transistors and of the pads;

fastening of a heat sink plate in contact with the heat sink layer.

BRIEF DESCRIPTION OF THE DRAWINGS

The various subjects and characteristics of the invention will appear more clearly in the description which follows and in the appended figures which show.

DESCRIPTION OF THE PREFERRED EMBODIMENTS

Figure 1:
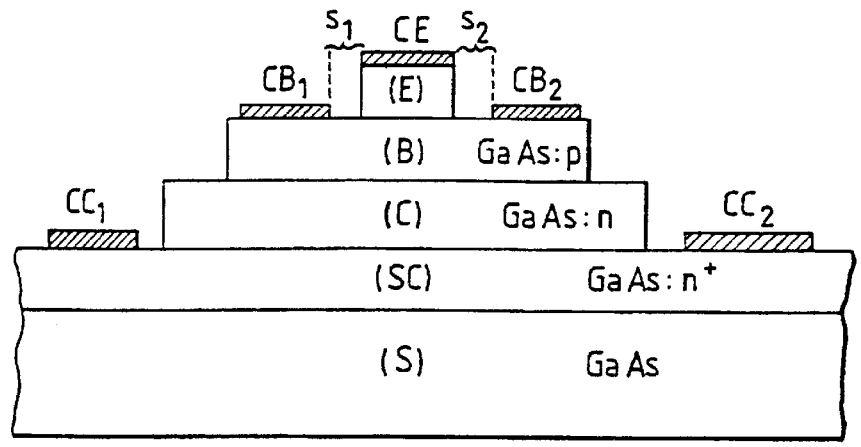
FIG. 1, HBT transistors known in the art and described above.
Figure 2:
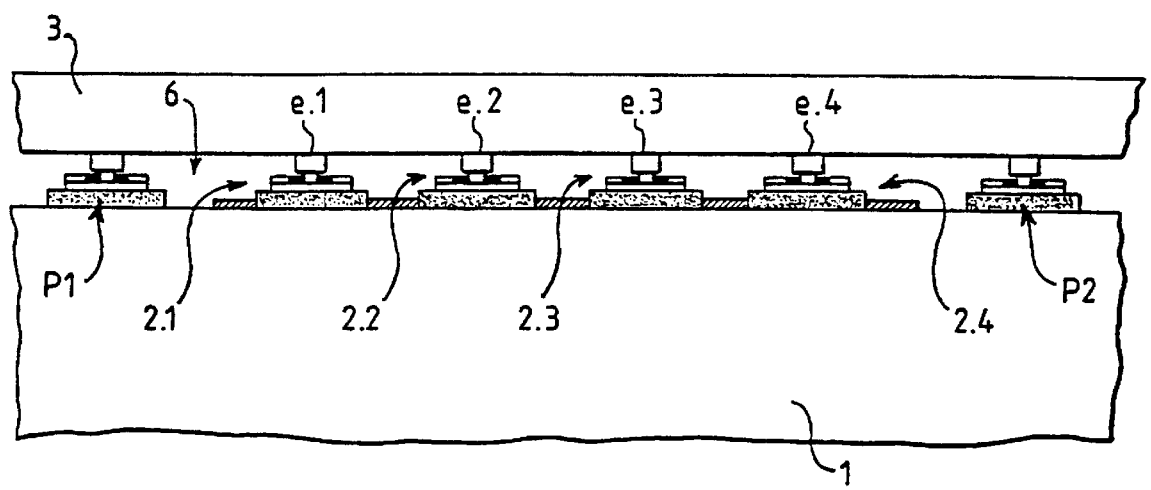
FIG. 2, an embodiment of the device of the invention.

Referring to FIG. 2, an embodiment of the device of the invention will therefore now be described. This device comprises, produced on a substrate 1, a transistor consisting of a number of elementary transistors 2.1 to 2.4. Each elementary transistor consists of a stack of layers as described in relation to FIG. 1. These elementary transistors are produced collectively so that their upper parts each terminated by an emitter contact e.1 to e.3 are all virtually at the same level.

According to the invention, pads P1 and P2 are produced on each side) (or at least on one side) of all the elementary transistors. Preferably, these pads are produced at the same time, in the same layers and using the same techniques as the elementary transistors 2.1 to 2.4. They therefore have the same shape as these transistors and the same height. However, these pads are passive from the electronic standpoint and therefore are not the site of heating. They are simply thermal conductors. The spaces between the elementary transistors and between these elementary transistors are filled with an insulating material, the upper part of which is flush with the upper parts of the elementary transistors and of the pads. The whole assembly has an upper face 6 which is plane.

A plate which is a good heat conductor is placed on the upper face 6. Preferably, this heat sink plate is therefore plane. This plate is in contact with the upper parts of the elementary transistors and of the pads, or is even soldered to these upper parts.

Under these conditions, the heat from the transistors will be stored in the plate during each pulse and will then be dissipated into the substrate 1 via the pads P1 and P2.

According to a preferred embodiment, the plate 3 is made of diamond. It may be soldered to the upper faces of the transistors and of the pads using a tin-based alloy.

Figure 3:
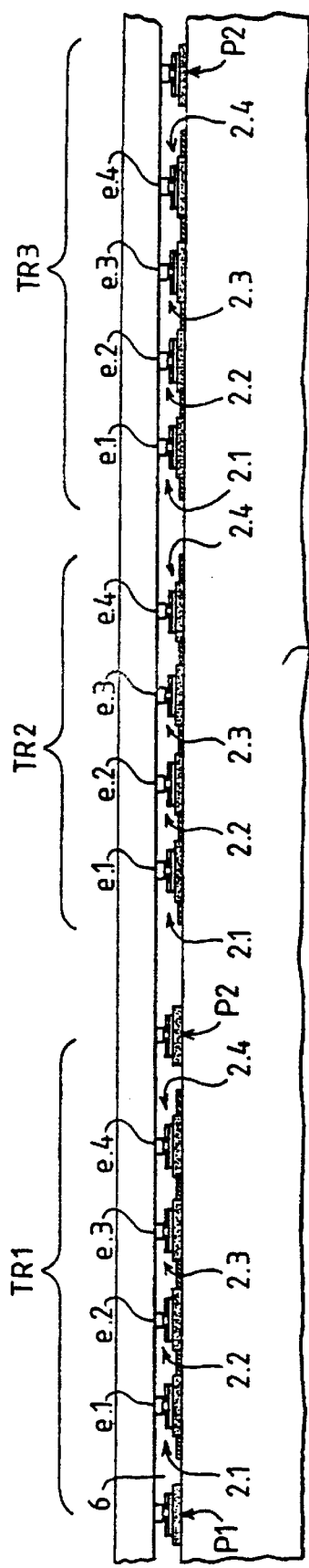
FIG. 3, an embodiment of the invention applied to several HBT transistors.

FIG. 3 shows an embodiment comprising several transistors TR1 to TR3. The heat sink plate may be common to all or some of the transistors. Pads such as P1, P2 may be provided on each side of the transistor, but this is not absolutely necessary as shown in the case of the transistors TR2 and TR3.

Figure 4:
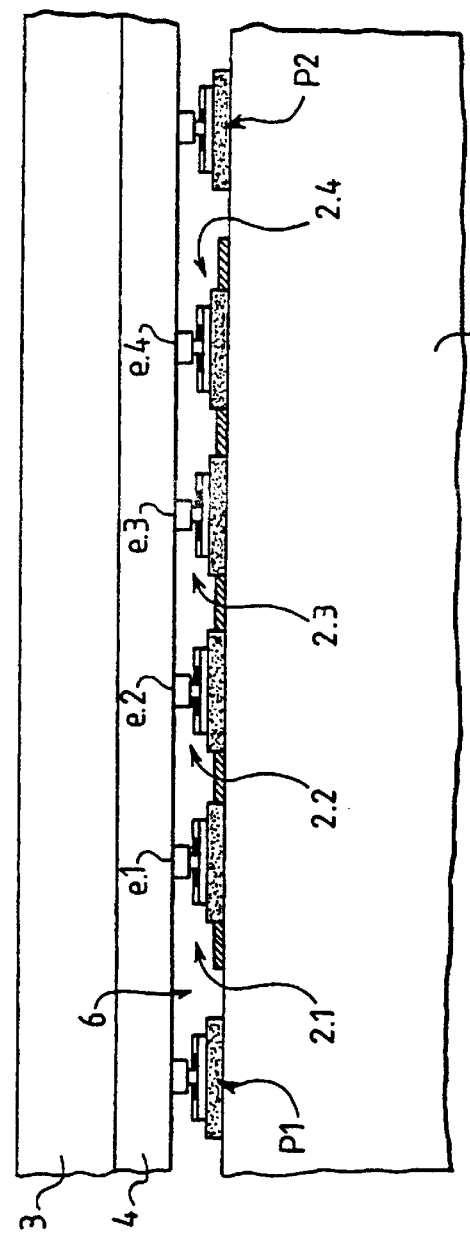
FIG. 4, a variant of the embodiment in FIG. 2.

According to FIG. 4, a layer 4 constituting a thermal shunt in contact with the upper parts of the transistors and of the pads has been provided between the heat sink plate and the transistors. This layer is preferably made of a metal, for example gold. The heat sink plate 3 is then soldered to this layer 4.

Thus, according to the invention, the heat sink plate 3 fulfils the role of a thermal capacitor on the heterojunction bipolar transistors so as to rapidly absorb almost all the heat generated during a pulse faster than can be achieved by the semiconductor material itself, whether it is based on gallium arsenite, indium phosphide, or even silicon or silicon germanium or indeed even silicon carbide.

The invention therefore consists more specifically in soldering above the thermal shunt 4 a parallelepiped 3 made of polycrystalline synthetic diamond, which is polished and metallized on the face in contact with the thermal shunt 4.

According to another embodiment, the heat sink may be produced by growing a material having a thermal effusivity similar to diamond.

The thermal effusivity $\{(\lambda.\rho.c_p)^{1/2}\}$ of diamond is approximately 8 times greater than that of gallium arsenite as may be calculated from the table below.

| Material | Thermal conductivity $\lambda$ (W/cm $°$ C.) | Specific heat $c_p$ (J/g) | Density $\rho$ (g/cm$^3$) | Effusivity |
|---|---|---|---|---|
| GaAs | 0.3 | 0.3 | 5.3 | 0.68 |
| Silicon | 0.83 | 0.7 | 2.33 | 1.16 |
| Diamond | 10 | 0.52 | 3.52 | 4.27 |

The thickness of the diamond must be close to or greater than the thermal diffusion length "L" during a pulse of duration τ, i.e. equal to or greater than 450 microns for a 200 microsecond pulse.

Thus, if it is assumed that the thickness of the thermal shunt 4 is negligible and its effect under transient conditions at the gold/gallium arsenite interface, the temperature is, by continuity, the same and the amounts of heat dissipated on either side are proportional to their thermal effusivities.

If $\Delta T_0$ and $\Delta T_1$ are, respectively, the temperature rises of the junction during a pulse with, first, the device alone with its thermal shunt and, secondly, the device on which a diamond parallelepiped has been intimately soldered, adhesively bonded or welded, we have:

$\Delta T_1$ and $\Delta T_0.\text{effusivity}_{GaAs}/(\text{effusivity}_{GaAs} + \text{effusivity}_{diamond})$, i.e. approximately $\Delta T_0/9$.

The heat thus stored in the diamond parallelepiped 4 during a pulse is then dissipated between two pulses by passing back through the gold shunt or through the semiconductor material 5 and 5' which may be gallium arsenite as in the case taken as an example. Since the time between two pulses is typically ten times longer than that of one pulse, this dissipation contributes little to the thermal resistance of the assembly.

In continuous mode, it is possible according to the invention to considerably reduce the thermal resistance of a bipolar transistor with a thermal shunt.

Thus, it is possible to connect the thermal capacitor described above to the thermal ground of the transistor over a wider base so as to dissipate the average heat generated by the transistor more conveniently. In this case, the diamond parallelepiped must bear on two gallium arsenite pillars left at the same height as the emitters during the etching of the latter. The thermal resistance is then inversely proportional to the area that may be granted to the construction of these pillars.

A component as shown in FIG. 2 may be produced according to the following process:
  production on a substrate (1) of an alternation of the following layers, with the materials indicated by way of example in parenthesis:
    subcollector layer (n$^+$:GaAs)
    collector layer ($\mu$:GaAs)
    emitter layer (n:GaInP);
  etching of the various layers above so as to produce the elementary transistors 2.1 to 2.4 and the pads P1 and P2;
  production of the base contacts (CB1, CB2) and collector contacts (CC1, CC2);
  filling of the free spaces between the transistors and the pads with an insulating material and planarization so as to obtain a surface flush with the upper faces of the transistors and of the pads;
  deposition of a layer which constitutes a heat sink layer making contact with the upper faces of the transistors and of the pads;
  fastening of a heat sink plate in contact with the heat sink layer.

The advantages of our process over the conventional solutions are as follows:
  reduction in the operating (junction) temperature;
  decrease in the variation in the junction temperature variation in the pulses;
  limited interference of the electromagnetic environment of the component, allowing rapid design modifications;
  unexpected improvement in the reliability in connection with the lower operating temperature;
  improvement in the phase stability during pulses;
  increase in the maximum power ($P_{out}$) that can be used;
  improvement in the reliability.

The invention has been described in the form of applications to heterojunction bipolar transistors (HBT), but it is applicable to any other type of component.

What is claimed is:

1. An electronic component to be operated in a pulse mode, comprising:
  a substrate;
  a first stack of layers on said substrate, said first stack of layers including a first top layer;
  a heat sink element in contact with said first top layer; and
  at least one thermally conducting passive pad on said substrate and spaced apart from said first stack of layers, said passive pad including a second stack of layers with a second top layer in contact with said heat sink element.

2. The electronic component as claimed in claim 1, wherein said first stack of layers forms at least a portion of a heterojunction bipolar transistor.

3. The electronic component as claimed in claim 2, wherein the heterojunction bipolar transistor comprises a plurality of stacks of layers, said stacks of layers being placed next to each other in parallel between said substrate and said heat sink element, and wherein each of said stacks includes a top layer in contact with said heat sink element.

4. The electronic component as claimed in claim 3, further comprising a second passive pad on said substrate, said second passive pad being in contact with said heat sink element and located on one side of said heterojunction bipolar transistor, and wherein said at least one thermally conducting passive pad is located on another side of said heterojunction bipolar transistor.

5. The electronic component as claimed in claim 3, wherein the heat sink element comprises a diamond plate.

6. The electronic component as claimed in claim 5, wherein the diamond plate is soldered to said stacks of the heterojunction bipolar transistor and to the passive pads.

7. The electronic component as claimed in claim 6, wherein the solder includes a tin-based alloy.

8. The electronic component as claimed in claim 4, further comprising an insulating material between the stacks of layers of the heterojunction bipolar transistor and between the stacks of layers of the heterojunction bipolar transistor and the passive pads, said insulating material being flush with said heat sink element.

9. The electronic component as claimed in claim 5, wherein the diamond plate is made of polycrystalline diamond and wherein said heat sink element comprises a metalized face in contact with said top layers of the stacks of layers of said heterojunction bipolar transistor and with the passive pads.

10. The component as claimed in claim 3, wherein the heat sink element comprises a material having a thermal effusivity similar to diamond.

11. A process for manufacturing an electronic component to be operated in a pulse mode, comprising the steps of:
  forming a plurality of elementary transistors on a substrate;
  forming at least one passive pad on said substrate simultaneously with said step of forming said elementary transistors;
  filling spaces between said elementary transistors and said at least one passive pad with an insulating material so as to form a surface flush with top portions of said elementary transistors and of said at least one passive pad; and
  placing a thermally conducting plate on said flush surface in contact with said top portions of said elementary transistors and of said at least one passive pad.

12. The process of claim 11, further comprising the step of soldering said thermally conducting plate to said top portions of said elementary transistors and of said at least one passive pad.

13. The process of claim 11, wherein said step of forming said plurality of elementary transistors comprises:
  forming a plurality of layers; and
  etching said plurality of layers, and
  wherein said step of forming said at least one passive pad comprises said steps of forming and etching said plurality of layers.

14. The process of claim 11, wherein said step of forming said at least one passive pad on said substrate simultaneously with said step of forming said elementary transistors comprises forming a first passive pad on one side of said elementary transistors and forming a second passive pad on another side of said elementary transistors.

15. The electronic component of claim 1, wherein said first and second top layers are made of a same electrically and thermally conducting material.

16. The electronic component of claim 15, wherein said first stack and said second stack have a same shape and a same height.

17. The electronic component of claim 1, wherein said heat sink element has a plane shape.

18. The electronic component of claim 1, wherein said heat sink element comprises:
- a metal layer in contact with said first and second top layers, and
- a layer of polycrystalline synthetic diamond on said metal layer.

19. The electronic component of claim 1, wherein the heat sink element has a thickness equal to or greater than a thermal diffusion length corresponding to a pulse applied to said electronic component.

20. The electronic component of claim 1, wherein the heat sink element has a thickness equal to or greater than 450 microns.

* * * * *